United States Patent
Winniczek et al.

(10) Patent No.: US 8,598,037 B2
(45) Date of Patent: Dec. 3, 2013

(54) SILICON ETCH WITH PASSIVATION USING PLASMA ENHANCED OXIDATION

(75) Inventors: Jaroslaw W. Winniczek, Daly City, CA (US); Robert P. Chebi, San Carlos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/339,301

(22) Filed: Dec. 28, 2011

(65) Prior Publication Data

US 2012/0100720 A1 Apr. 26, 2012

Related U.S. Application Data

(62) Division of application No. 12/257,210, filed on Oct. 23, 2008, now Pat. No. 8,173,547.

(51) Int. Cl.
*H01L 21/3065* (2006.01)
*H01L 21/308* (2006.01)

(52) U.S. Cl.
USPC ........... 438/695; 438/689; 438/696; 438/719; 257/E21.218; 257/E21.231

(58) Field of Classification Search
USPC .......... 438/689, 696, 719, 695; 257/E21.218, 257/E21.231
See application file for complete search history.

(56) References Cited

U.S. PATENT DOCUMENTS

| | | | |
|---|---|---|---|
| 5,843,226 A | 12/1998 | Zhao et al. | |
| 5,863,376 A | 1/1999 | Wicker et al. | |
| 5,904,520 A | 5/1999 | Liaw et al. | |
| 6,127,278 A * | 10/2000 | Wang et al. | 438/719 |
| 6,225,228 B1 | 5/2001 | Srinivasan | |
| 6,284,666 B1 | 9/2001 | Naeem et al. | |
| 6,387,804 B1 | 5/2002 | Foster | |
| 6,458,648 B1 | 10/2002 | Molloy et al. | |
| 6,491,835 B1 | 12/2002 | Kumar et al. | |
| 7,129,178 B1 | 10/2006 | Schwarz et al. | |
| 7,169,255 B2 | 1/2007 | Yasui et al. | |
| 2002/0009891 A1 | 1/2002 | Ting et al. | |

(Continued)

FOREIGN PATENT DOCUMENTS

| | | |
|---|---|---|
| JP | 11-97414 | 4/1999 |
| JP | 2001-319925 | 11/2001 |

(Continued)

OTHER PUBLICATIONS

Nishino et al. (Journal of Applied Physics, vol. 74, No. 2, (1993), pp. 1345-1348).*

(Continued)

*Primary Examiner* — Duy Deo
*Assistant Examiner* — Mahmoud Dahimene
(74) *Attorney, Agent, or Firm* — Beyer Law Group LLP

(57) ABSTRACT

A method of etching a silicon layer through a patterned mask is provided. The method uses an etch chamber in which the silicon layer is placed. The method includes (a) providing the silicon layer having the patterned mask formed thereon, (b) providing an etch gas comprising a fluorine containing gas and an oxygen and hydrogen containing gas into the etch chamber in which the silicon layer has been placed, (c) generating a plasma from the etch gas, (d) etching features into the silicon layer through the patterned mask using the plasma, and (e) stopping the etch gas. The oxygen and hydrogen containing gas contains water vapor.

18 Claims, 6 Drawing Sheets

(56) References Cited

U.S. PATENT DOCUMENTS

| | | |
|---|---|---|
| 2002/0061621 A1 | 5/2002 | Grebs et al. |
| 2002/0179570 A1 | 12/2002 | Mathad et al. |
| 2003/0022512 A1 | 1/2003 | Saito et al. |
| 2003/0162407 A1 | 8/2003 | Maex et al. |
| 2003/0232504 A1 | 12/2003 | Eppler et al. |
| 2004/0069412 A1 | 4/2004 | Inomata et al. |
| 2004/0221797 A1 | 11/2004 | Mosden et al. |
| 2004/0222190 A1 | 11/2004 | Horiguchi et al. |
| 2004/0241342 A1 | 12/2004 | Karim et al. |
| 2005/0014372 A1 | 1/2005 | Shimonishi et al. |
| 2005/0056941 A1 | 3/2005 | Vanhaelemeersch et al. |
| 2005/0126710 A1 | 6/2005 | Laermer et al. |
| 2005/0136682 A1 | 6/2005 | Hudson et al. |
| 2005/0142828 A1 | 6/2005 | Kammler et al. |
| 2005/0145341 A1 | 7/2005 | Suzuki |
| 2005/0158975 A1 | 7/2005 | Liu et al. |
| 2006/0219174 A1 | 10/2006 | Nguyen et al. |
| 2006/0228860 A1 | 10/2006 | Shinohara et al. |
| 2007/0080136 A1 | 4/2007 | Takata et al. |
| 2007/0111467 A1 | 5/2007 | Kim |
| 2007/0232071 A1 | 10/2007 | Balseanu et al. |
| 2008/0020582 A1 | 1/2008 | Bai |
| 2008/0061029 A1* | 3/2008 | Lai et al. .......... 216/37 |

FOREIGN PATENT DOCUMENTS

| | | |
|---|---|---|
| JP | 2005-11827 | 1/2005 |
| JP | 2005-175460 | 6/2005 |
| JP | 2007-103876 | 4/2007 |
| JP | 10-92798 | 4/2010 |
| JP | 10-256260 | 9/2010 |
| KR | 2000-0064946 | 11/2000 |
| WO | WO2006/83592 | 8/2006 |

OTHER PUBLICATIONS

S. Wolf and R.N. Tauber, (Silicon Processing for the VLSI Era, vol. 1—Process Technology, Lattice Press, 1986)(pp. 542-557).*

Office Action dated Jul. 24, 2012 from Japanese Patent Application No. 2010-539663.
Notice of Allowance dated Feb. 3, 2012 from U.S. Appl. No. 12/257,210.
Written Opinion dated Mar. 14, 2012 from Singapore Patent Application No. 201004075-6.
Search Report dated Mar. 14, 2012 from Singapore Patent Application No. 201004075-6.
Final Office Action dated May 21, 2012 from U.S. Appl. No. 12/338,950.
Nishino et al., "Damage-free selective etching of Si native oxides using NH3/NF3 and SF6/H2O down-flow etching," Journal of Applied Physics, vol. 74, No. 2, 1993, pp. 1345-1348.
Office Action dated Sep. 14, 2011 from U.S. Appl. No. 12/257,210.
Final Office Action dated Oct. 5, 2011 from U.S. Appl. No. 12/338,950.
Office Action dated May 27, 2011 from U.S. Appl. No. 12/257,215.
Final Office Action dated Sep. 29, 2011 from U.S. Appl. No. 12/257,215.
Wolf et al "Silicon Processing for the VLSI Era", vol. 1—Process Technology, Lattice Press, 1986, pp. 542-557.
Office Action dated May 11, 2011 from U.S. Appl. No. 12/257,210.
U.S. Appl. No. 12/257,215, filed Oct. 23, 2008.
Office Action dated Apr. 15, 2011 from U.S. Appl. No. 12/338,950.
U.S. Appl. No. 12/338,950, filed Dec. 18, 2008.
Search Report dated Apr. 22, 2010 from International Application No. PCT/US2009/060214.
Search Report dated Apr. 22, 2010 from Internaitonal Application No. PCT/US2009/060218.
Search Report dated Jun. 24, 2009 from International Application No. PCT/US2008/086722.
Written Opinion dated Apr. 22, 2010 from International Application No. PCT/US2009/060214.
Written Opinion dated Apr. 22, 2010 from International Application No. PCT/US2009/060218.
Written Opinion dated Jun. 24, 2009 from International Application No. PCT/US2008/086722.
U.S. Appl. No. 12/257,210, filed Oct. 23, 2008.

* cited by examiner

SILICON ETCH WITH PASSIVATION USING PLASMA ENHANCED OXIDATION

CROSS REFERENCE TO RELATED APPLICATION

This application is a Divisional of and claims benefit of priority to U.S. patent application Ser. No. 12/257,210 filed Oct. 23, 2008, which is incorporated herein by reference.

BACKGROUND OF THE INVENTION

The present invention relates to the formation of semiconductor devices. More specifically, the present invention relates to the etching of features into silicon material.

Features such as via holes and trenches are formed in a silicon substrate using anisotropic etching in which sidewalls of the features are protected from etching reaction by a passivation layer formed thereon. The etch gas typically contains halogen gas (such as $SF_6$) for chemical etching and oxygen ($O_2$) gas for passivation. The passivation layer is typically an oxide film containing silicon oxide (SiOx-based film) formed by oxidation of the feature sidewalls. The composition of the passivation layer may be affected by etch chemistry and mask material. Too much sidewall passivation may cause pinch-off, and too little side wall passivation may cause bowing, undercut and CD (critical dimension) degradation.

Deep features may also be formed in silicon substrates by the use of "rapidly alternating" plasma etch processes (gas modulation processes), which utilize a fast repetition of alternating plasma etch cycle and deposition (passivation) cycle. In general, $SF_6$ and $C_4F_8$ are the principal process gases for the etch and deposition cycles, respectively. A sidewall-protecting polymer layer is deposited during the $C_4F_8$ passivation cycle so as to achieve directional etch. During the $SF_6$ etch cycle, the passivation polymer is removed from horizontal surfaces (such as the bottom of vias) by ion-enhanced etching, and then silicon is etched isotropically from the exposed areas by free fluorine.

In a gas modulation process, the process gases supplied to a plasma processing reactor are rapidly toggled on and off, resulting in the process quickly changing from the etch condition where silicon is removed from the wafer, to the deposition condition where material is deposited onto the wafer and silicon is not removed, and then back again to the etch condition. The duration of the alternating cycles is typically relatively short, and a large number of cycles are typically required to achieve a desired depth into the silicon substrate.

SUMMARY OF THE INVENTION

To achieve the foregoing and in accordance with the purpose of the present invention, in one embodiment, a method of etching a silicon layer through a patterned mask formed thereon is provided. The silicon layer is placed in an etch chamber. An etch gas comprising a fluorine containing gas and an oxygen and hydrogen containing gas is provided into the etch chamber. A plasma is generated from the etch gas and features are etched into the silicon layer through the patterned mask using the plasma. The etch gas is then stopped. The oxygen and hydrogen containing gas contains water vapor.

In another manifestation of the invention, a method of etching a silicon layer through a patterned mask formed thereon using a downstream plasma is provided. The silicon layer is placed in an etch chamber. An etch gas comprising a fluorine containing gas is provided into an upstream plasma chamber. A plasma is generated from the etch gas. A reaction medium from the plasma is introduced into the etch chamber, and a passivation gas containing oxygen and hydrogen is also provided into the etch chamber such that the reaction medium contains OH radicals. Features are etched into the silicon layer using the reaction medium. The reaction medium and the passivation gas are then stopped. The passivation gas may contain at least one of water vapor or alcohol.

In another manifestation of the invention, an apparatus for etching features into a silicon layer through a patterned mask is provided. The apparatus includes a plasma processing chamber, an etching gas source, and a controller. The plasma processing chamber comprises a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, at least one RF power source electrically connected to the at least one electrode, a gas inlet for providing gas into the plasma processing chamber enclosure, and a gas outlet for exhausting gas from the plasma processing chamber enclosure. The etching gas source is in fluid connection with the gas inlet, and includes an fluorine containing gas source and an oxygen and hydrogen containing gas source. The controller is controllably connected to the gas source, the RF bias source, and the at least one RF power source. The controller comprises at least one processor, and computer readable media including computer readable code for etching the silicon layer. The computer readable code for etching the silicon layer includes (a) computer readable code for flowing a fluorine containing gas from the fluorine containing gas source into the plasma chamber, (b) computer readable code for flowing an oxygen and hydrogen containing gas from the oxygen and hydrogen containing gas source into the plasma chamber, (c) computer readable code for forming a plasma from the fluorine containing gas and the oxygen and hydrogen containing gas, (d) computer readable code for providing a bias voltage, (e) computer readable code for etching features into the silicon layer, and (f) computer readable code for stopping the fluorine containing gas and the oxygen and hydrogen containing gas.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
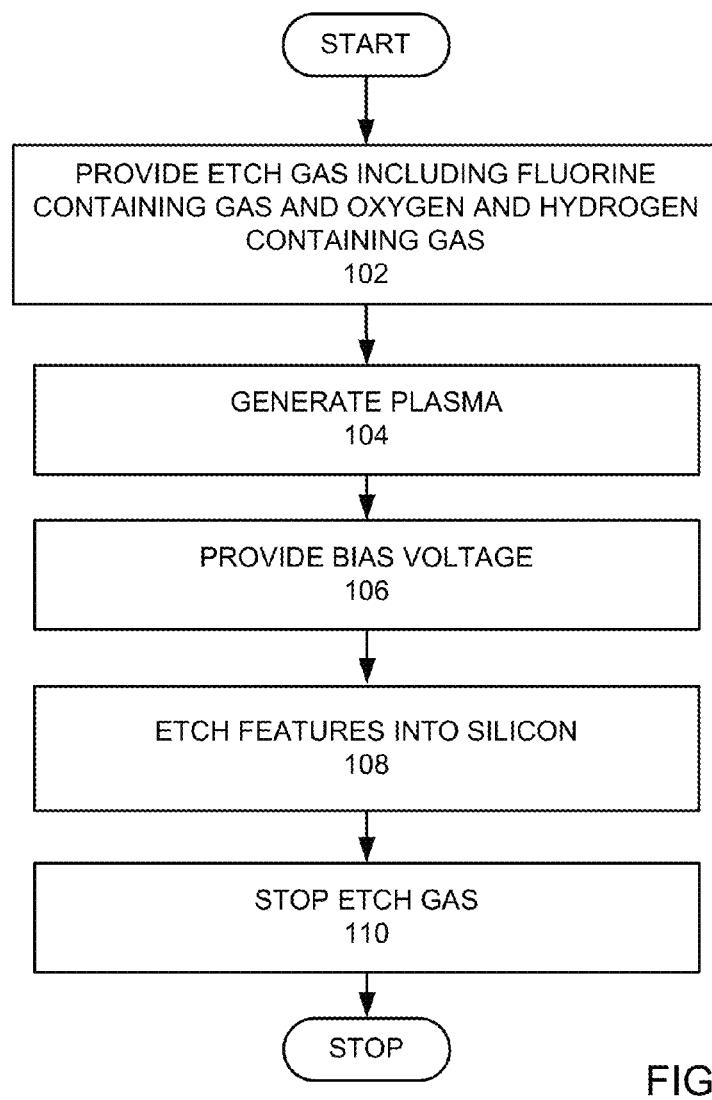
FIG. 1 is a high level flow chart of a process of etching a silicon layer in accordance with an embodiment of the invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As described above, sidewall passivation is used in silicon etch in order to protect the sidewalls of features from lateral etch to achieve anisotropic etch of features. For example, substantially vertical profile can be obtained by forming proper sidewalls during silicon etch process. In the conventional steady-state silicon etch, a sidewall wall passivation layer is formed by oxidation of the silicon feature sidewall. The resulting passivation layer is typically a silicon oxide film. In the gas modulation process, on the other hand, a sidewall passivation layer is deposited using a plasma formed from a carbon-containing gas, such as $C_4F_8$, during a deposition step, while a silicon layer is etched using a plasma formed from a fluorine-containing gas such as $SF_6$ in a subsequent etch step, where the deposition step and the etch step are rapidly alternated. The resulting passivation layer is typically a polymer.

Applicants used an oxygen-containing gas, such as $O_2$, $SO_2$, $CO_2$, CO as a passivation gas to form an oxide-based passivation layer to protect feature sidewalls during an etch process using a fluorine-containing gas such as $SF_6$. The sidewall passivation layer contains $SiO_2$ (if $O_2$ is used); SiOx (if $SO_2$ is used/added); and/or SiC or SiOC (if $CO_2$ and/or CO are used/added). $N_2O$ or $NO_2$ may also used or added, which results in a passivation layer further containing SiN or SiON. Other gases, such as $B_2H_6$, $BCl_3$ may also be added, where the passivation layer may also contain SiOBN or SiBN. In order to build a passivation layer which is thin enough to meet design requirements and also strong and durable enough to protect the feature sidewalls, Applicants have developed a novel passivation gas and a resulting novel passivation layer.

In accordance with embodiments of the present invention, the composition of a sidewall passivation layer is modified using OH radicals such that the passivation layer contains SiOH, or more generally, $SiO_xH_y$, where $x \geq 1$ and $y \geq 1$. In order to provide OH radicals in plasma, the passivation gas contains oxygen and hydrogen. For example, the passivation gas includes water vapor and/or alcohol. If the passivation gas contains alcohol, the passivation layer may further contain SiCOH and/or SiOC, or more generally, $SiC_nO_xH_y$, where $n \geq 0$, $x \geq 1$, $y \geq 0$, and n and y are not both zero. It is believed that oxidation of silicon (growth of passivation layer) using water vapor or alcohol vapor (OH radicals) is faster than that using oxygen (O type radicals). The passivation layer may also contain SiOx.

To facilitate understanding, FIG. 1 is a high level flow chart of a process used in an embodiment of the invention, in which a silicon layer is etched through a patterned mask formed thereon using an etch chamber. An etch gas comprising a fluorine (F) containing gas and an oxygen (O) and hydrogen (H) containing gas is provided into the etch chamber in which the silicon layer is placed (step 102). For example, the fluorine containing gas contains $SF_6$. The fluorine containing gas may further contain $SiF_4$. In addition, the fluorine containing gas may be $NF_3$ or $CF_4$, or a combination of $SF_6$, $NF_3$, $SiF_4$ and/or $CF_4$. Other halogen-containing gas may also be added to the etch gas. The oxygen and hydrogen containing gas, which acts as a passivation gas, is water vapor in accordance with one embodiment of the present invention. The oxygen and hydrogen containing gas may also be alcohol ($C_nH_{2n-1}$—OH). In yet another embodiment, the oxygen and hydrogen containing gas may contain water vapor and alcohol. The etch gas may further contain $O_2$, and/or at least one of $CO_2$ or CO. In addition, ketones (such as acetone, $CH_3CO$—$CH_3$) may also be used as the passivation gas, in addition to CO, $CO_2$, water, and/or alcohol. Furthermore, other chemicals such as aldehydes (containing a terminal carbonyl group —CHO), esters (having a general structure R—COO—R', where R' is the alkyl group, and R is the carboxylate group), and ethers (having a general structure R—O—R). It should be noted that a carrier gas and/or diluent gas may be added to the chemistry in order to provide certain reaction effects.

In accordance with one embodiment of the present invention, the passivation gas may be produced from a liquid precursor (water or liquid alcohol) by vaporization. The OH radicals (or water vapor) may also be produced from high temperature $O_2$ gas and $H_2$ gas using a downstream plasma reactor. The passivation gas (water vapor or alcohol) may be mixed with the fluorine containing gas before being introduced into the etch chamber. Alternatively, the fluorine containing gas and the passivation gas may be introduced from separate gas inlets into the etch chamber where the plasma is generated.

Referring to FIG. 1, a plasma is generated from the etch gas (step 104) containing the fluorine containing gas and the oxygen and hydrogen containing passivation gas (for example, water vapor and/or alcohol). In the plasma, the water vapor provides hydroxyl radicals (OH), and alcohol provides hydroxyl groups (OH). It should be noted that "hydroxyl groups" are typically used to describe the functional group —OH when it is a substituent in an organic compound. In this specification and the claims, "hydroxyl" or "hydroxyl radicals" means both of the hydroxyl radicals (from an inorganic compound or water) and hydroxyl groups (from an organic compound or alcohol).

Figure 2:
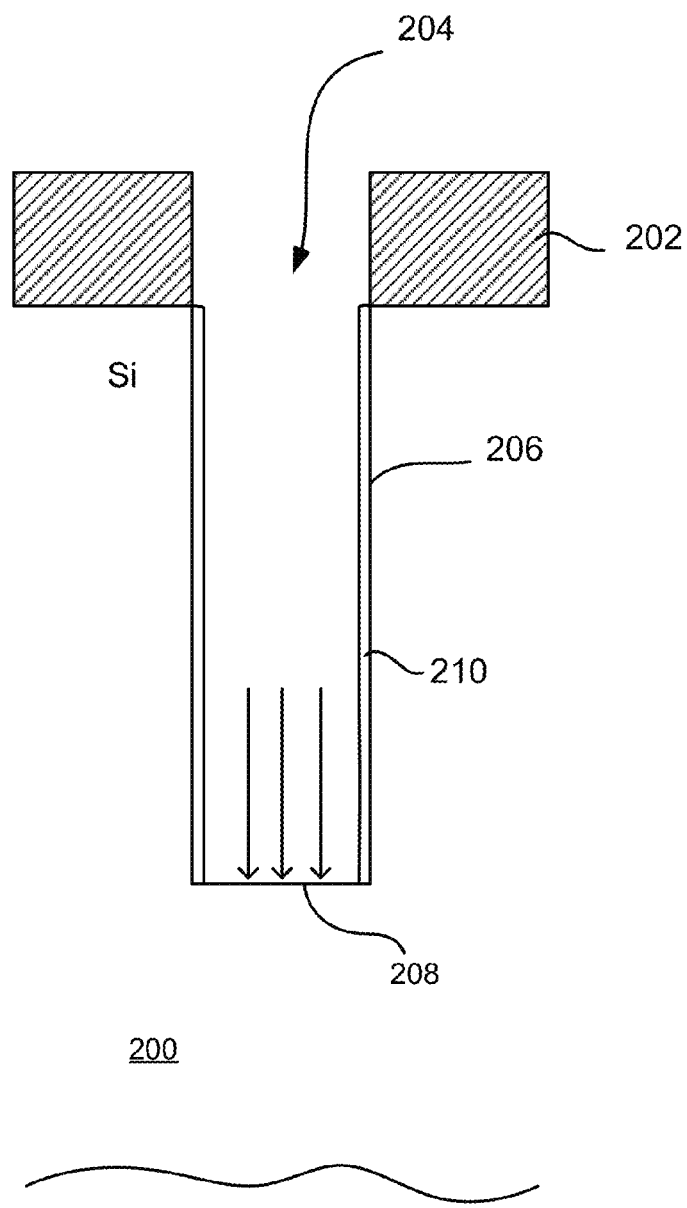
FIG. 2 schematically illustrates an example of a cross-section of a silicon layer in which a feature is being etched, in accordance with one embodiment of the present invention.

A bias voltage is provided (step 106), and features are etched into the silicon layer using the plasma (step 104). To facilitate understanding, FIG. 2 illustrates an example of a cross-section of a silicon layer 200 in which a feature is being etched. The silicon layer 200 may be a silicon wafer. The silicon material may be crystalline silicon, polysilicon, or amorphous silicon. The silicon material may also be doped or strained silicon. A patterned mask 202 is provided over the silicon layer 200, which defines a feature 204 on the silicon material. The mask 202 may be a photoresist (PR) mask or a hard mask (oxide). The mask 202 may also include other layers under the mask, such as a conductive layer and/or a dielectric layers which may have been etched in previous steps (not shown). The feature 204 etched into the silicon material may have a vertical (i.e. substantially 90 degrees) profile angle, as shown in FIG. 2. The feature 204 may have a tapered profile (i.e. a profile angle less than 90 degrees) depending on the application. The silicon etch may be deep silicon etch in which features are etched to a depth ranging from 5 microns to 400 microns, whereas typical thickness of layers of a competed COMS device is 3 to 5 microns. The present invention is suitable for deep silicon etching, especially with high aspect ratio. For example, an aspect ratio of the features may be least 80, or alternatively, the depth of the features may be at least 80 μm.

In accordance with embodiments of the present invention, the sidewall passivation layer 210 is formed using OH radicals and the composition is modified compared with SiOx-based passivation layers. Oxidation of silicon is believed to be faster using OH radicals than O type radicals. The passivation layer of embodiments of the present invention contains SiOH. The passivation layer may also contain SiOx. More generally, the passivation layer contains $SiO_xH_y$, where $x \geq 1$ and $y \geq 1$. When alcohol is used, the passivation layer may further contain SiCOH and/or SiOC. More generally, the passivation layer contains $SiC_nO_xH_y$, where $n \geq 0$, $x \geq 1$, $y \geq 0$, and n and y are not both zero.

It is also believed that a passivation layer containing SiOH ($SiO_xH_y$ or $SiC_nO_xH_y$) is thinner and stronger (durable) than the conventional SiOx-based passivation layer without SiOH components. During the etch process, passivation takes place on the sidewalls 206 and the bottom 208 of the feature 204. Since a bias voltage is provided (FIG. 1, step 106), charged particles (ions) bombard the bottom 208 of the feature, but not or less on the sidewalls 206. Thus, on the sidewalls, formation of the passivation layer 210 continues to protect the sidewall 206 from the etchant (F) radials. On the other hand, at the bottom 208 of the feature, the passivation layer is being formed and at the same time being removed by ion assisted etching, and the exposed silicon is etched by radicals. The passivation layer 210 containing $SiO_xH_y$ and/or $SiC_nO_xH_y$ is not easily etched by radicals, and requires ion bombardment to remove.

After the desired feature is etched (step 108), the etch gas is stopped (step 110).

A high etch efficiency and desired process flexibility may be achieved with a continuous, non-alternating etch process (steady-state) using the etch gas comprising a fluorine containing gas such as $SF_6$, and an oxygen and hydrogen containing gas (passivation gas), as described above. The process is continuous because, even though the supply gas flow set points may change during the process (e.g. ramped from a higher value to a lower value, or vice versa), the etch gas flows are not toggled on and off; rather, the gas supplies remain on continuously while the feature 204 is etched into the silicon layer 200. The process is non-alternating because it does not change from an "etch" condition to a "deposition" condition; rather, etching of the silicon and inhibition of etching (passivation) occur simultaneously during the etch processes. The etch efficiency of such a continuous process may be significantly improved over a rapidly alternating process because silicon is being removed during 100% of the total process time. In addition, because the gas flows are continuous, standard hardware such as gas flow controllers may be used, thus reducing the cost and complexity of the system needed to support the process.

An example of a steady-state silicon etch process uses an etch gas comprising $SF_6$ and $H_2O$ vapor with 2500 W of TCP power, 250V bias voltage. The etch gas flow may include 800 sccm $SF_6$ and 300 sccm $H_2O$ vapor. The etch gas flow may include 80 sccm $O_2$, and 50 sccm CO at 80 mTorr. Alternatively, if alcohol is used, the chemistry includes: 800 sccm $SF_6$ and 300 sccm $C_2H_5OH$ (ethanol) or $CH_3OH$ (methanol) vapor. The etch gas flow may include 120 sccm $O_2$, and 50 sccm CO at 80 mTorr. Wafer substrate temperature is set at 0° C. Furthermore, in addition to the use of CO, $CO_2$, and alcohol, ketones (such as acetone, $CH_3CO$—$CH_3$) may also be used.

In addition, process performance and flexibility of the continuous etch process may be enhanced by changing typical process parameters such as plasma power, wafer bias power, process chamber pressure, or the like, during the continuous etch process. For example, the plasma power supply, and/or the wafer bias voltage may be pulsed in an on/off or high/low fashion in order to balance the ratio of neutral to charged reactive plasma components reaching the wafer. In another example, the plasma power, the wafer bias power, and/or the pressure in the plasma processing chamber may be ramped from a high value to a low value, or vice versa, during the continuous etch process.

Figure 3:
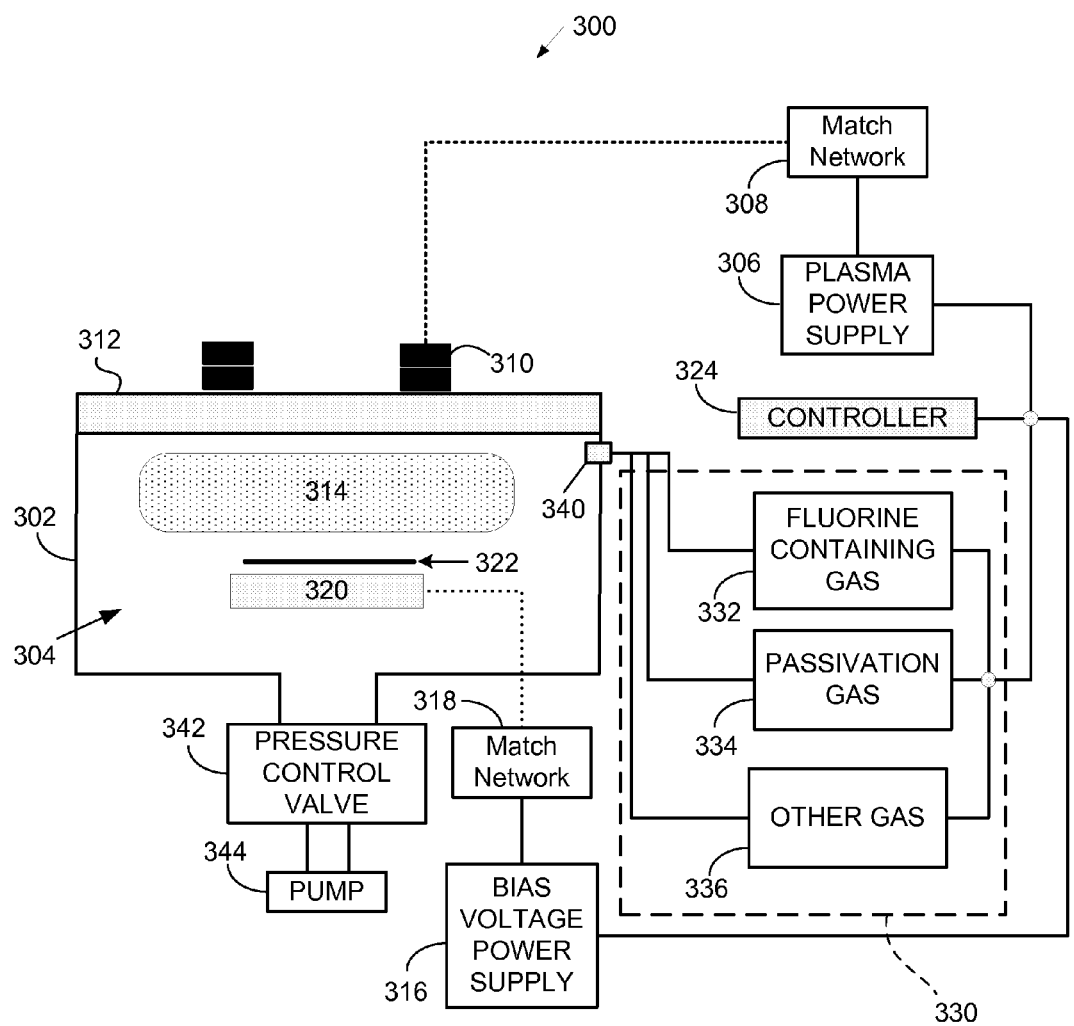
FIG. 3 is a schematic view of an example of a plasma processing system which may be used to carry out an embodiment of the invention.

FIG. 3 schematically illustrates an example of a plasma processing system 300 which may be used to perform the process of etching a silicon layer in accordance with one embodiment of the present invention. The plasma processing system 300 includes a plasma reactor 302 having a plasma processing chamber 304 therein. A plasma power supply 306, tuned by a match network 308 supplies power to a TCP coil 310 located near a window 312 to create a plasma 314 in the plasma processing chamber 304. The TPC coil (upper power source) 310 may be configured to produce a uniform diffusion profile within processing chamber 304. For example, the TPC coil 310 may be configured to generate a toroidal power distribution in the plasma 314. The window 312 is provided to separate the TPC coil 310 from the plasma chamber 304 while allowing energy to pass from the TPC coil 310 to the plasma chamber 304. A wafer bias voltage power supply 316 tuned by a match network 318 provides power to an electrode 320 to set the bias voltage on a wafer 322 which is supported by the electrode 320. A controller 324 sets points for the plasma power supply 306 and the wafer bias voltage supply 316.

The plasma power supply 306 and the wafer bias voltage power supply 316 may be configured to operate at specific radio frequencies such as, for example, 13.56 MHz, 27 MHz, 2 MHz, 400 kHz, or combinations thereof. Plasma power supply 306 and wafer bias power supply 316 may be appropriately sized to supply a range of powers in order to achieve desired process performance. For example, in one embodiment of the present invention, the plasma power supply 306 may supply the power in a range of 300 to 10000 Watts, and the wafer bias voltage power supply 316 may supply a bias voltage of in a range of 10 to 1000 V. In addition, the TPC coil 310 and/or the electrode 320 may be comprised of two or more sub-coils or sub-electrodes, which may be powered by a single power supply or powered by multiple power supplies.

As shown in FIG. 3, the plasma processing system 300 further includes a gas source/gas supply mechanism 330. The gas source includes a fluorine containing gas source 332, a passivation gas source (oxygen and hydrogen containing gas source) 334, and optionally, an additional gas source 336. The gas sources 332, 334, and 336 are in fluid connection with processing chamber 304 through a gas inlet 340. The gas inlet 340 may be located in any advantageous location in chamber 304, and may take any form for injecting gas, such as a single nozzle or a showerhead. Preferably, however, the gas inlet 340 may be configured to produce a "tunable" gas injection profile, which allows independent adjustment of the respective flow of the gases to multiple zones in the process chamber 304. The process gases and byproducts are removed from the chamber 304 via a pressure control valve 342 and a pump 344, which also serve to maintain a particular pressure within the plasma processing chamber 304. The gas source/gas supply mechanism 330 is controlled by the controller 324.

The plasma processing system 300 may also include a window cooling system (not shown) to reduce the temperature gradient across the window 312 and to reduce the overall operating temperature of window 312.

Figure 4:
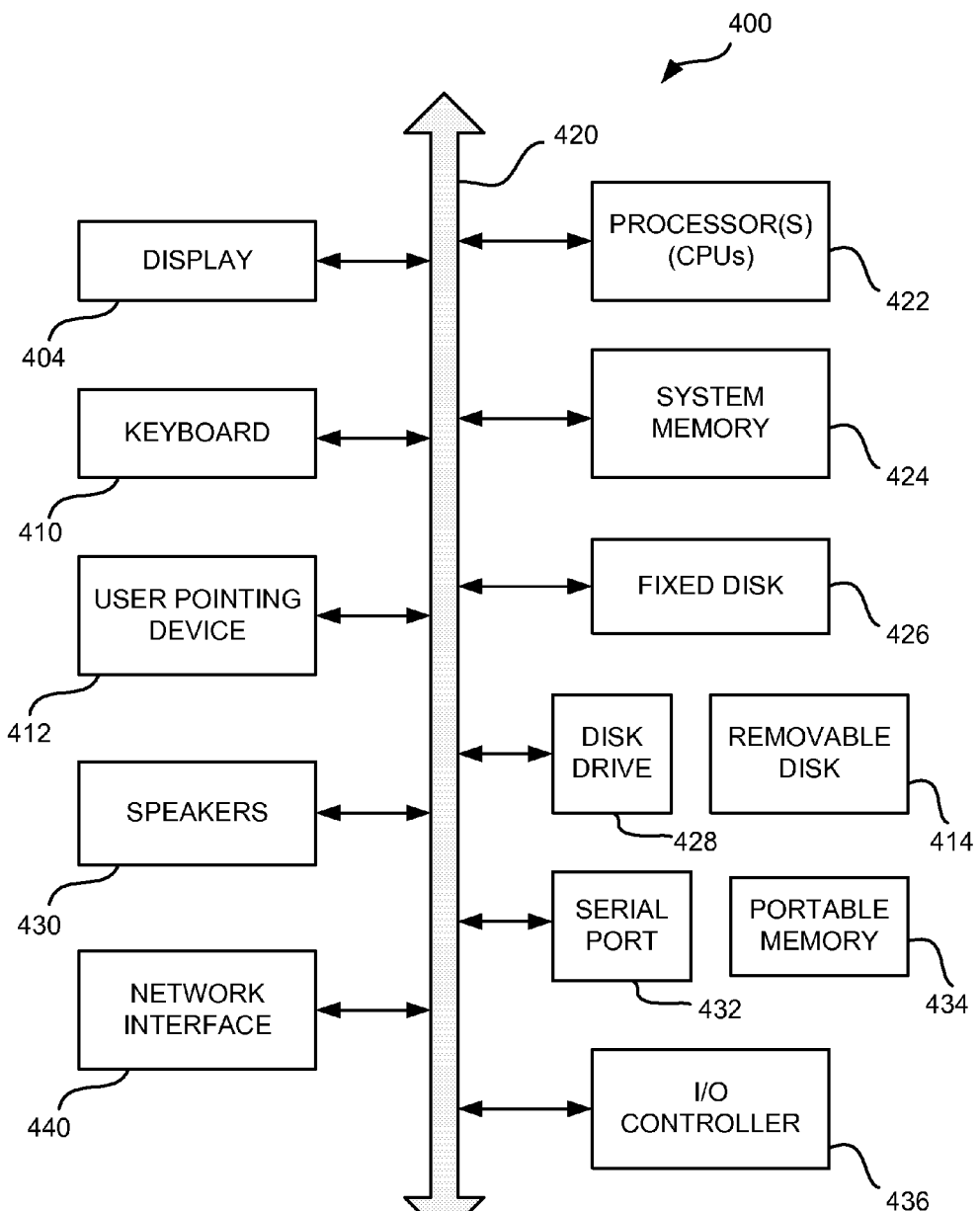
FIG. 4 illustrates a computer system, which is suitable for implementing a controller used in embodiments of the invention.

FIG. 4 schematically illustrates a block diagram of a computer system 400 suitable for implementing a controller 324 (in FIG. 3), which may be used in one or more embodiments of the present invention. The computer system 400 may have many physical forms ranging from an integrated circuit, a printed circuit board, and a small handheld device up to a huge super computer. In the computer system 400, attached to a system bus 420 is a wide variety of subsystems. Processor(s) 422 (also referred to as central processing units, or CPU's) are coupled to storage devices, including a system memory 424. The memory 424 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable kind of the computer-readable media described below. A fixed disk 426 is also coupled bi-directionally to the CPU 422; it provides additional data storage capacity and may also include any of the computer-readable media described below. The fixed disk 426 may be used to store programs, data, and the like and is typically a secondary storage medium (such as a hard disk) that is slower than primary storage. It will be appreciated that the information retained within the fixed disk 426 may, in appropriate cases, be incorporated in standard fashion as virtual memory in the memory 424. A removable disk 414 may be used via a disk drive 428 to transfer data to and from the computer system 400. The removable disk 414 may take the form of any of the computer-readable media described below. A portable memory 434 such as a USB flash drive may also be used via a serial port 432.

The CPU 422 is also coupled to a variety of input/output devices, such as a display 404, a keyboard 410, a user pointing device 412 such as a computer mouse, speakers 430, and an input/output (I/O) controller 436. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. The CPU 422 may be coupled to another computer or telecommunications network using network interface 440. With such a network interface, it is contemplated that the CPU 422 might receive information from the network, or might output information to the network in the course of performing the above-described method steps. Furthermore, method embodiments of the present invention may execute solely upon CPU 422 or may execute over a network such as the Internet in conjunction with a remote CPU that shares a portion of the processing.

The computer system 400 may be configured to collect and store relevant process data such as gas flows, pressures, temperature, power, and the like, in order to diagnose the plasma processing system and to control the plasma process.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floppy disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level of code that are executed by a computer using an interpreter. Computer readable media may also be computer code transmitted by a computer data signal embodied in a carrier wave and representing a sequence of instructions that are executable by a processor.

Figure 5:
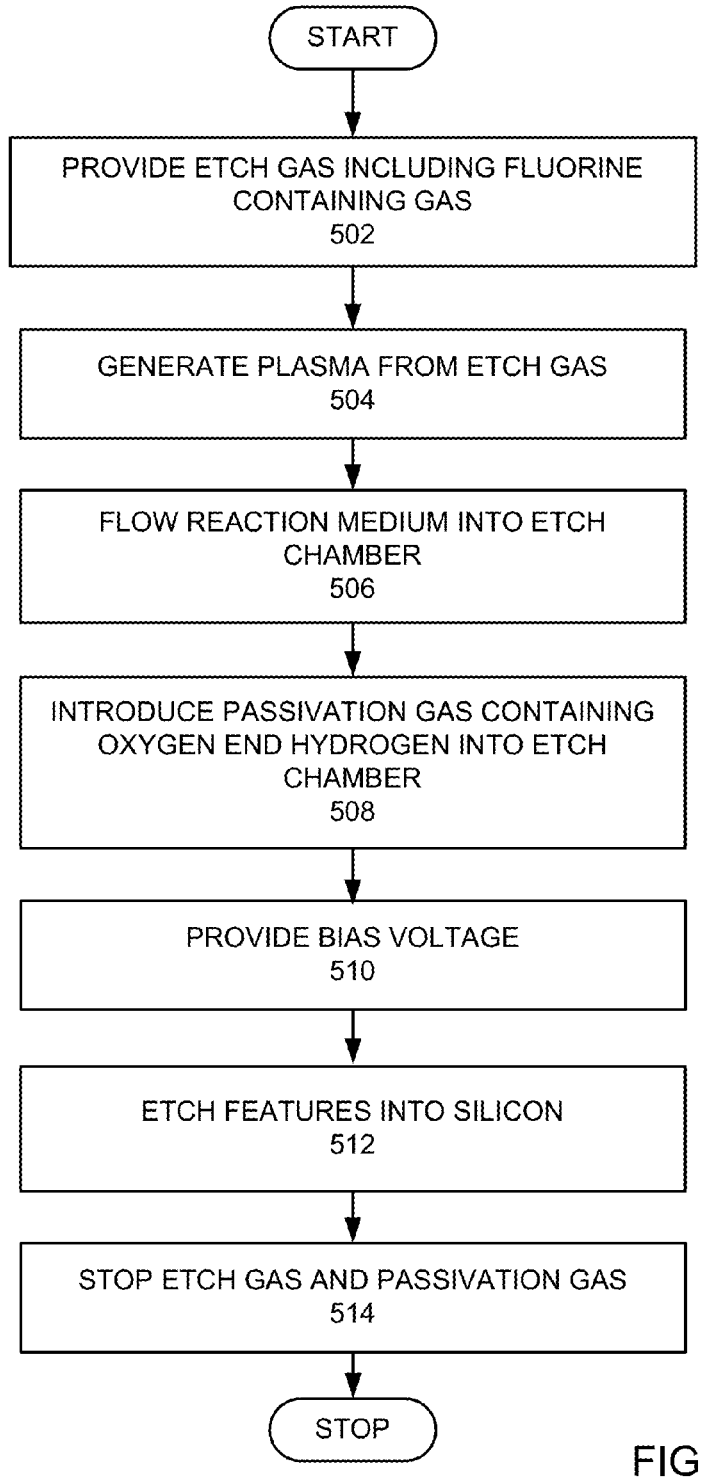
FIG. 5 is a high level flow chart of a process of etching a silicon layer in accordance with another embodiment of the invention.
Figure 6:
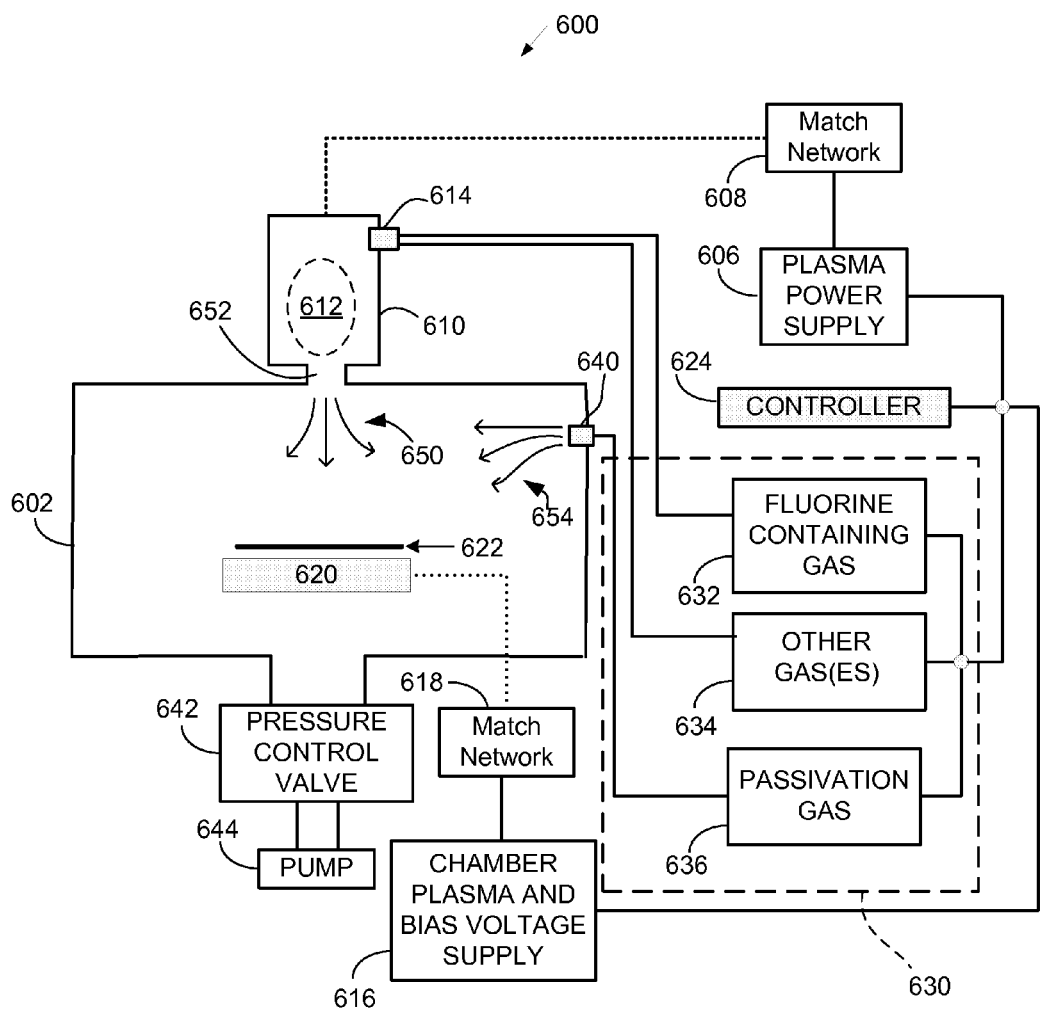
FIG. 6 is a schematic view of an example of a downstream plasma processing system which may be used to carry out an embodiment of the invention.

In accordance with one embodiment of the present invention, a downstream plasma chamber is used for etching a silicon layer, and the passivation gas flow may be introduced downstream of the plasma. FIG. 5 schematically illustrates a process used in an embodiment of the invention, in which a silicon layer is etched through a patterned mask formed thereon using a downstream plasma chamber. FIG. 6 schematically illustrates an example of a downstream plasma processing system 600 which may be used to perform the process of etching a silicon layer in accordance with one embodiment of the present invention.

As shown in FIG. 6, the downstream plasma processing system 600 includes an etch chamber 602 and an upstream plasma chamber 610. A plasma power supply 606, tuned by a match network 608 supplies power to the upstream plasma chamber 610 located on the top of the etch chamber 602. The upstream plasma chamber 610 may energize a plasma 612 using RF power or microwave. A reaction medium 650 flows from the plasma 612 into the etch chamber 602 through a port 652. A wafer based plasma source and biase voltage power supply 616 provides plasma and bias voltage. The power supply 616, which is tuned by a match network 618, provides power to an electrode 620 on which the wafer is positioned, to provide plasma over the wafer and set the bias voltage on a wafer 622 which is supported by the electrode 620. A controller 624 sets points for the upstream plasma power supply 606 and the wafer based plasma source and bias voltage supply 616. The controller 624 may be implemented using the computer system 400 (FIGS. 4A and 4B) described above. In addition, the wafer based plasma source and bias voltage power supply 616 may provide one or more frequencies. For example, 13.56 MHz alone, 27 MHz with 2 MHz, and 27 MHz or higher (such as 60 MHz) with 400 kHz may be used. The wafer based plasma source and bias voltage power supply 616 may include two separate generators: a higher frequency generator as the plasma source, and the other with a lower frequency as the bias voltage source.

The downstream plasma processing system 600 further includes a gas source/gas supply mechanism 630. The gas source includes a fluorine containing gas source 632, a passivation gas source (oxygen and hydrogen containing gas source) 636, and optionally, an additional gas source 634. The fluorine containing gas source 632 and additional gas source (optional) 634 are in fluid connection with the plasma chamber 610 through a gas inlet 614. The passivation gas source 634 is in fluid connection with the etch chamber 602 through a gas inlet 640. The gas inlets 614 and 640 may be located in any advantageous location in the upstream plasma chamber 610 and the etch chamber 602, respectively, and may take any form for injecting gas, such as a single nozzle or a showerhead. Preferably, however, the gas inlets 614 and 640 may be configured to produce a "tunable" gas injection profile, which allows independent adjustment of the respective flow of the gases. The process gases and byproducts are removed from the etch chamber 604 via a pressure control valve 642 and a pump 644, which also serve to maintain a particular pressure within the plasma processing chamber 604. The gas source/gas supply mechanism 630 is controlled by the controller 624.

As shown in FIG. 5, an etch gas comprising a fluorine containing gas is provided into the upstream plasma chamber 610 (step 502), and a plasma 612 is generated from the etch gas (step 504). The etch gas may contain other components similarly to the previous embodiments, which may be provided form the additional gas source 634. A reaction medium 650 from the plasma 612 is transported into the etch chamber 602 (step 506). The reaction medium 650 contains radicals and ions. A passivation gas 654 containing oxygen and hydrogen (for example, water vapor and/or alcohol) is introduced into the etch chamber 602 through the inlet 640 (step 508) such that the reaction medium 650 contains OH radicals. A bias voltage is provided (step 510), and features are etched into the silicon layer using the reaction medium (step 512). Then, the reaction medium and the passivation gas are stopped (step 514).

In accordance with another embodiment of the present invention, the novel passivation gas may also be used in etching steps of a gas modulation process, which consists of iterative alternative deposition and etching steps. Typically, the deposition step uses a deposition gas containing $C_4F_8$, and the etching step uses an etch gas containing $SF_6$. The passivation gas containing oxygen and hydrogen (for example, water vapor and/or alcohol) may be added to the etch gas containing $SF_6$ in the etching steps.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method of etching a silicon layer through a patterned mask formed thereon using an etch chamber in which the silicon layer is placed, the method comprising:
   providing the silicon layer having the patterned mask formed thereon;
   providing an etch gas comprising a fluorine containing gas and an oxygen and hydrogen containing gas into the etch chamber in which the silicon layer has been placed;
   generating a plasma from the etch gas;
   etching features into the silicon layer through the patterned mask using the plasma; and
   stopping the etch gas,
   wherein said oxygen and hydrogen containing gas contains water vapor, the fluorine containing gas contains $SF_6$, and a flow ratio of $H_2O$ with respect to $SF_6$ is greater than 0.24.

2. The method according to claim 1, wherein the plasma contains OH radicals.

3. The method according claim 1, further comprising:
   providing a bias voltage during said etching.

4. The method according to claim 1 wherein said etching includes:
   forming a passivation layer containing $SiO_xH_y$ on a sidewall of the features being etched, where $x \geq 1$ and $y \geq 1$.

5. The method according to claim 1, wherein the etching features into the silicon layer comprises:
   forming a passivation layer on a sidewall of the features being etched so as to protect the sidewall from etchant radicals; and
   forming and removing a passivation layer on a bottom of the features being etched so as to etch the exposed silicon layer.

6. The method according to claim 1, wherein the fluorine containing gas further contains $SiF_4$.

7. The method according to claim 1, wherein the etch gas further contains $O_2$.

8. The method according to claim 7, wherein the etch gas further contains at least one of $CO_2$ or CO.

9. The method according to claim 1, wherein a flow ratio of $H_2O$ with respect to a total gas flow is between about 0.24 to about 0.38.

10. The method according to claim 1, wherein the etch gas and the oxygen and hydrogen containing gas are introduced into the etch chamber separately from different gas inlets provided at different locations.

11. A method of etching a silicon layer through a patterned mask formed thereon using an etch chamber in which the silicon layer is placed, the method comprising:
    providing the silicon layer having the patterned mask formed thereon;
    providing an etch as comprising a fluorine containing as and an oxygen and hydrogen containing gas into the etch chamber in which the silicon layer has been placed;
    generating a plasma from the etch gas;
    etching features into the silicon layer through the patterned mask using the plasma; and
    stopping the etch gas,
    wherein said oxygen and hydrogen containing gas contains water vapor, the fluorine containing gas contains $SF_6$, and a flow ratio of $H_2O$ with respect to $SF_6$ is about 3/8.

12. A method of etching a silicon layer through a patterned mask formed thereon using an etch chamber in which the silicon layer is placed, the method comprising:
    providing the silicon layer having the patterned mask formed thereon;
    providing an etch gas comprising a fluorine containing gas and an oxygen and hydrogen containing gas into the etch chamber in which the silicon layer has been placed;
    generating a plasma from the etch gas;
    etching features into the silicon layer through the patterned mask using the plasma; and
    stopping the etch gas,
    wherein the etch gas essentially consists of SF6 and H20; essentially consists of SF6, H20, and 02; essentially consists of SF6, H20, 02, and CO2; essentially consists of SF6, H20, 02, and CO; essentially consists of SF6, H20, 02, CO2, and CO; essentially consists of SF6, SiF4, and H20; essentially consists of SF6, SiF4, H20, and 02; essentially consists of SF6, SiF4, H20, 02, and CO2; essentially consists of SF6, SiF4, H20, 02, and CO; or essentially consists of SF6, SiF4, H20, 02, CO2, and CO.

13. The method according claim 12, further comprising:
    providing a bias voltage during said etching.

14. The method according to claim 12 wherein said etching includes:
    forming a passivation layer containing $SiO_xH_y$ on a sidewall of the features being etched, where $x \geq 1$ and $y \geq 1$.

15. The method according to claim 12, wherein the etching features into the silicon layer comprises:
    forming a passivation layer on a sidewall of the features being etched so as to protect the sidewall from etchant radicals; and
    forming and removing a passivation layer on a bottom of the features being etched so as to etch the exposed silicon layer.

16. The method according to claim 12, wherein a flow ratio of $H_2O$ with respect to $SF_6$ is greater than 0.24.

17. The method according to claim 12, wherein a flow ratio of $H_2O$ with respect to $SF_6$ is about ⅜.

18. The method according to claim 14, wherein a flow ratio of $H_2O$ with respect to a total gas flow is between about 0.24 to about 0.38.

* * * * *